(12) United States Patent
Oh et al.

(10) Patent No.: US 8,378,354 B2
(45) Date of Patent: Feb. 19, 2013

(54) LIQUID CRYSTAL DISPLAY PANEL FOR COMMON VOLTAGE COMPENSATION AND MANUFACTURING METHOD OF THE SAME

(75) Inventors: Chang Ho Oh, Daegu (KR); Hyun Cheol Jin, Gyeongsangbuk-do (KR); Jin Young Park, Gyeonggyi-do (KR); Young Mi Tak, Gyeonggyi-Do (KR)

(73) Assignee: LG Display Co., Ltd., Seoul (KR)

( * ) Notice: Subject to any disclaimer, the term of this patent is extended or adjusted under 35 U.S.C. 154(b) by 84 days.

(21) Appl. No.: 11/474,365

(22) Filed: Jun. 26, 2006

(65) Prior Publication Data

US 2007/0164288 A1 Jul. 19, 2007

(30) Foreign Application Priority Data

Dec. 27, 2005 (KR) .................. 10-2005-0130758

(51) Int. Cl.
*H01L 29/04* (2006.01)
(52) U.S. Cl. ........................... 257/72; 257/59
(58) Field of Classification Search ............ 257/59, 257/72, 347; 349/39, 143
See application file for complete search history.

(56) References Cited

U.S. PATENT DOCUMENTS

| 6,028,650 | A | 2/2000 | Kuroha et al. |
| 6,115,018 | A | 9/2000 | Okumura et al. |
| 2003/0063233 | A1* | 4/2003 | Takagi ............................. 349/65 |
| 2003/0098934 | A1* | 5/2003 | Lee et al. ........................ 349/39 |
| 2004/0125262 | A1 | 7/2004 | Cho et al. |
| 2004/0169798 | A1* | 9/2004 | Iwasa ............................. 349/113 |
| 2005/0088599 | A1* | 4/2005 | Hashiguchi et al. .......... 349/139 |
| 2007/0002229 | A1* | 1/2007 | Lee et al. ...................... 349/117 |

FOREIGN PATENT DOCUMENTS

JP 2002-303882 10/2002

* cited by examiner

*Primary Examiner* — Ori Nadav
(74) *Attorney, Agent, or Firm* — Morgan, Lewis & Bockius LLP

(57) ABSTRACT

A liquid crystal display panel where pixel cells defined by gate lines and data lines which are located to cross each other are arranged in a matrix shape, wherein each of the pixel cells includes a thin film transistor located at a crossing of the gate line and the data line, a pixel electrode connected to the thin film transistor, and a protrusion that overlaps a gate electrode of the thin film transistor to form a parasitic capacitor with the gate electrode and is connected to the pixel electrode, wherein each protrusion in the pixel cells of the liquid crystal display panel have an area determined in accordance with a location of the pixel cell in the liquid crystal display panel.

10 Claims, 17 Drawing Sheets

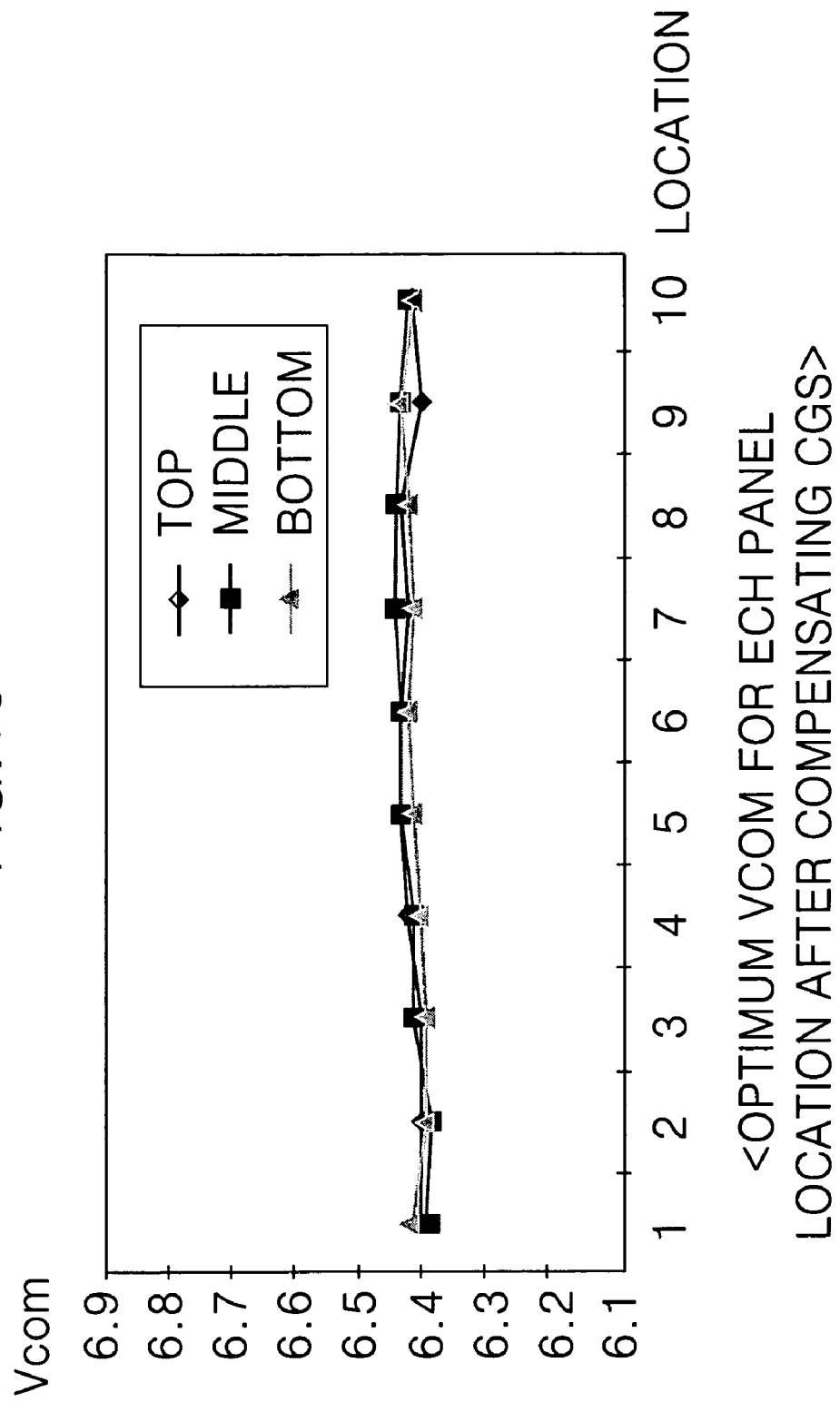

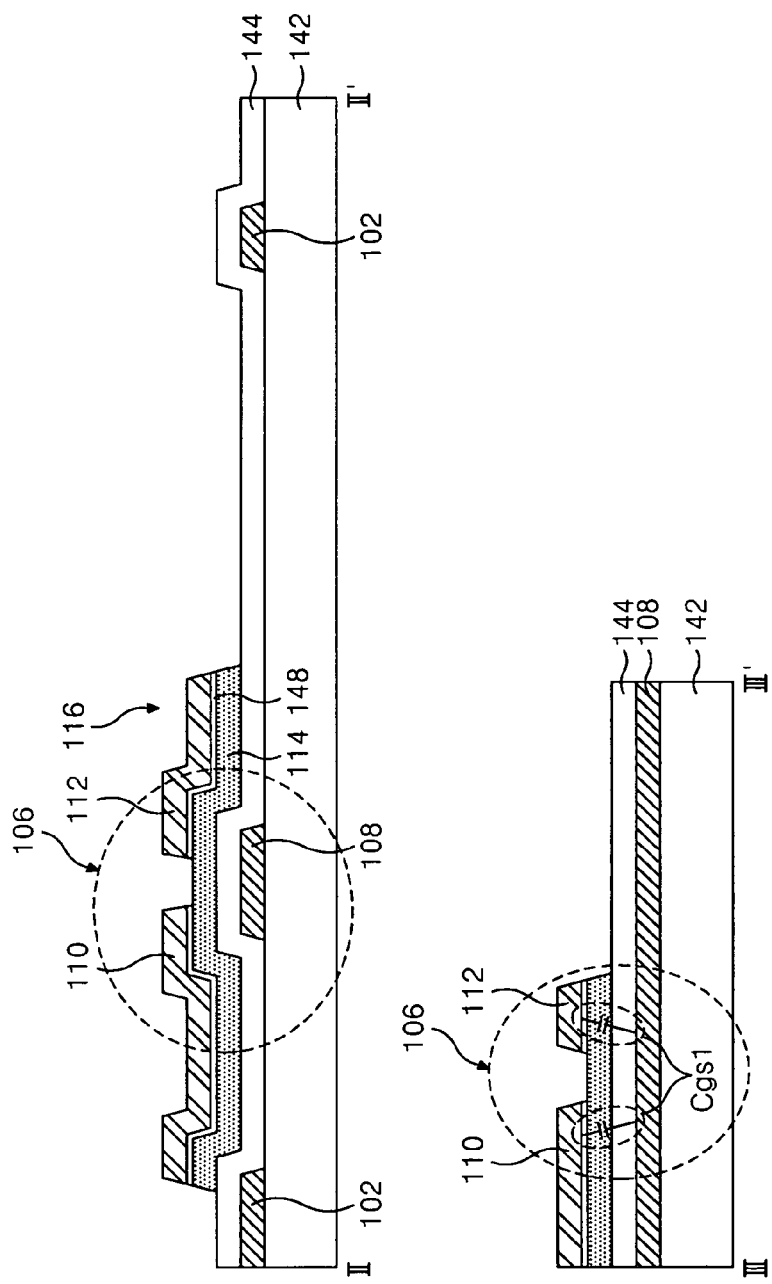

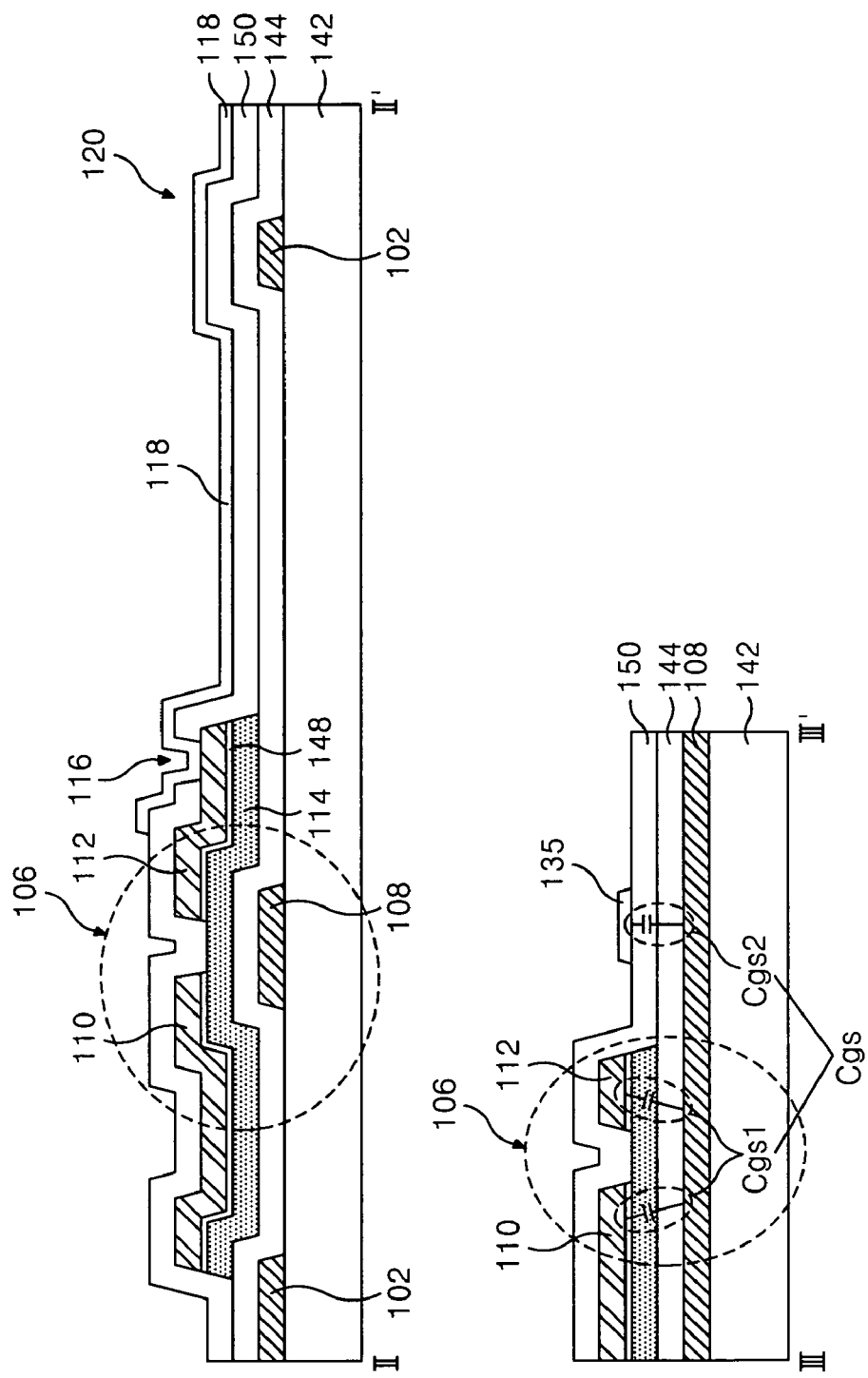

LIQUID CRYSTAL DISPLAY PANEL FOR COMMON VOLTAGE COMPENSATION AND MANUFACTURING METHOD OF THE SAME

This application claims the benefit of the Korean Patent Application No. P2005-0130758 filed on Dec. 27, 2005, which is hereby incorporated by reference in its entirety.

BACKGROUND OF THE INVENTION

1. Field of the Invention

The present invention relates to a display device, and more particularly to a liquid crystal display panel and manufacturing method of the same. Although the present invention is suitable for a wide scope of applications, it is particularly suitable for improving picture quality.

2. Description of the Related Art

Generally, a liquid crystal display device controls the light transmittance of liquid crystal by use of electric field, thereby displaying a picture. The liquid crystal display device includes a liquid crystal display panel containing liquid crystal cells arranged in a matrix type and a drive circuit for driving the liquid crystal display panel. The liquid crystal display panel includes a thin film transistor array substrate and a color filter array substrate that face each other, a spacer for keeping a fixed cell gap between the two substrates, and a liquid crystal filled into the cell gap.

The thin film transistor array substrate includes gate lines and data lines, a thin film transistor as a switch device at each crossing of the gate lines and the data lines, a pixel electrode in each liquid crystal cell connected to the thin film transistor, and an alignment film. The gate lines and the data lines receive signals from drive circuits through gate pads and data pads, respectively. The thin film transistor supplies a pixel voltage signal, which is supplied to the data line, thereby to the pixel electrode in response to a scan signal supplied to the gate line.

The color filter array substrate includes color filters respectively positioned for each liquid crystal cell, a black matrix for dividing the color filters and reflecting an external light, a common electrode for commonly supplying a reference voltage to the liquid crystal cells, and an alignment film.

The thin film transistor array substrate and the color filter array substrate are made separately and then bonded together. A liquid crystal is injected in the cell gap between the thin film transistor array substrate and the color filter array substrate and then the cell gap is sealed, thereby completing the liquid crystal display panel.

FIG. 1 is a plan view illustrating a thin film transistor array substrate of the related art, and FIG. 2 is a cross-sectional diagram of the thin film transistor array substrate shown in FIG. 1 along line I-I'. The thin film transistor array substrate shown in FIGS. 1 and 2 includes a gate line 2 and a data line 4, which are formed on a lower substrate 42 to cross each other with a gate insulating film 44 therebetween, a thin film transistor 6 (hereinafter, referred to as 'TFT') is connected to the gate line 2 and the data line 4, and a pixel electrode 18 is connected the TFT 6 in a pixel cell defined by the gate line 2 and the data line 4. And, the TFT array substrate includes a storage capacitor 20 overlapping a part of the pixel electrode 18 and the pre-stage gate line 2, which is the gate line of an adjacent pixel cell.

The TFT 6 includes a gate electrode 8 connected to the gate line 2, a source electrode 10 connected to the data line 4, a drain electrode 12 connected to the pixel electrode 18, and an active layer 14 that overlaps the gate electrode 8 and forms a channel between the source electrode 10 and the drain electrode 12. The active layer 14 is overlapped by the data line 4, the source electrode 10 and the drain electrode 12. Ohmic contact layers 48 are formed between the active layer 14 and each of the data line 4 and the source electrode 10 to form ohmic contacts between the active layer 14 and each of the data line 4 and the source electrode 10. The TFT 6 switches a pixel voltage signal from the data line 4 to the pixel electrode 18 in response to a gate signal supplied to the gate line 2.

The pixel electrode 18 is connected to the drain electrode 12 of the TFT 6 through a contact hole 16 which penetrates the passivation film 50. The pixel electrode 18 generates a potential difference with the common electrode formed on the color filter array substrate (not shown) with the pixel voltage. The potential difference causes liquid crystal molecules located between the TFT array substrate and the color filter array substrate to rotate by dielectric anisotropy, and transmits the light from a light source through the pixel electrode and the color filter array substrate.

The storage capacitor 20 is formed by the pixel electrode 18 overlapping the pre-stage gate line 2. A gate insulating film 44 and a passivation film 50 are located between the gate line 2 and the pixel electrode 18. The storage capacitor 20 maintains the pixel voltage on the pixel electrode 18 until the next pixel voltage is applied.

FIGS. 3A to 3D are cross-sectional diagrams illustrating a fabricating method of the thin film transistor array substrate shown in FIG. 2. First, a gate metal layer is patterned by a photolithography process and an etching process after forming the gate metal layer on a lower substrate 42 by a deposition method, such as sputtering, to form a gate pattern having the gate line 2 and the gate electrode 8, as shown in FIG. 3A.

A gate insulating film 44 is formed by a deposition method, such as plasma enhanced chemical vapor deposition (PECVD), on the lower substrate where the gate pattern is formed. An amorphous silicon layer, an n+ amorphous silicon layer and a source/drain metal layer are sequentially formed on the lower substrate 42 where the gate insulating film 44 is formed. A semiconductor pattern 45, including the ohmic contact layer 48 and the active layer 14, and a source/drain pattern 4/10/12, including the data line 4, the source electrode 10, the drain electrode 12, are formed on the semiconductor pattern 45 through a photolithography process using a diffractive mask and an etching process, as shown in FIG. 3B. On the other hand, the semiconductor pattern 45 can be formed separately from the source/drain pattern by use of a separate mask process.

A passivation film 50 is formed over the surface of the lower substrate 42, including the semiconductor pattern 45 and the source/drain pattern 4/10/12, by a deposition method, such as PECVD. The passivation film 50 is then patterned by a photolithography and etching process after forming the passivation film 50, thereby forming a contact hole 16, as shown in FIG. 3C. The contact hole 16 is formed to penetrate the passivation film 50 so as to expose the drain electrode 12.

A transparent electrode material is form over the entire surface of the passivation film 50 by a deposition method, such as sputtering. The transparent electrode material is then patterned by a photolithography and etching process to form the pixel electrode 18, as shown in FIG. 3D. The pixel electrode 18 is electrically connected to the drain electrode 12 through the contact hole 16. Further, the pixel electrode 18 is formed to overlap the pre-stage gate line 2 with the gate insulating film 44 and the passivation film 50 therebetween, thereby forming a storage capacitor 20.

FIG. 4 is a waveform diagram representing a voltage drop in accordance with locations of a common voltage and voltages supplied to the liquid crystal display panel. In the TFT array substrate, as shown in FIG. 4, a gate voltage Vg greater than a threshold voltage is supplied to the gate electrode 8 of the TFT 6 and a data voltage Vd is supplied to the source electrode 10. Further, a DC common voltage Vcom is applied to the common electrode that is located on the color filter array substrate in a TN mode liquid crystal display panel or on the IPS mode TFT array substrate in the liquid crystal display panel. Accordingly, a channel is formed between the source electrode 10 and the drain electrode 12 of the TFT 6 and the data voltage Vd is charged into the storage capacitor 20 through the source electrode 10 and the drain electrode 12 of the TFT.

The size of the common voltage Vcom supplied to the common electrode is decreased in accordance with the increase of line resistance as each pixel cell becomes farther away from the common voltage supplier. Thus, a voltage difference (d) is generated between an effective common voltage value (A) applied to the pixel cell close to the common voltage supplier and an effective common voltage value (B) applied to the pixel cell in a place remote from the common voltage supplier. For example, the common voltage Vcom in the liquid crystal display panel of TN mode is supplied to the common electrode formed across the entire surface of the color filter array substrate from conductors at an the outer part of the liquid crystal display panel such that the effective common voltage value becomes smaller as it goes toward the center of the liquid crystal display panel from the outer part of the liquid crystal display panel. Due to the non-uniformity of the common voltage, a picture difference for each location can be generated in the liquid crystal display panel 160, which can create a residual image and/or flicker.

SUMMARY OF THE INVENTION

Accordingly, the present invention is directed to a liquid crystal display panel and manufacturing method of the same that substantially obviates one or more of the problems due to limitations and disadvantages of the related art.

An object of the present invention to provide a liquid crystal display panel manufacturing method of the same for improving picture quality by minimizing residual image.

An object of the present invention to provide a liquid crystal display panel manufacturing method of the same for improving picture quality by minimizing flicker.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display panel where pixel cells defined by gate lines and data lines which are located to cross each other are arranged in a matrix shape, wherein each of the pixel cells includes a thin film transistor located at a crossing of the gate line and the data line, a pixel electrode connected to the thin film transistor, and a protrusion that overlaps a gate electrode of the thin film transistor to form a parasitic capacitor with the gate electrode and is connected to the pixel electrode, wherein each protrusion in the pixel cells of the liquid crystal display panel have an area determined in accordance with a location of the pixel cell in the liquid crystal display panel.

In another aspect, a fabricating method of a liquid crystal display panel having the step of forming a plurality of pixel cells which are arranged in a matrix shape, wherein forming each of the pixel cells includes forming a gate pattern, including a gate line and a gate electrode in contact with the gate line on a substrate, forming a semiconductor pattern that overlaps the gate line with a gate insulating film therebetween, a data line that crosses the gate line, a source electrode located on the semiconductor pattern, and a drain electrode which faces the source electrode, forming a passivation film having a contact hole that exposes the drain electrode; and forming a pixel electrode that is in contact with the drain electrode through the contact hole, and a protrusion over the gate line with the gate insulating film and the passivation film therebetween to form a parasitic capacitor and is connected to the pixel electrode.

In another aspect, A liquid crystal display panel where pixel cells defined by gate lines and data lines which are located to cross each other are arranged in a matrix shape, wherein each of the pixel cells includes a thin film transistor located at a crossing of the gate line and the data line, a thin film transistor having a gate electrode, a drain electrode and a source electrode, a pixel electrode connected to the thin film transistor, and a protrusion from the pixel electrode forming a parasitic capacitor with the gate electrode and positioned directly between the thin film transistor and a pre-stage pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 10 is a diagram representing a characteristic for each location of a common voltage which is optimized by the protrusion according to an embodiment of the present invention; and FIGS. 11A to 11D are cross sectional diagrams illustrating a fabricating method of the thin film transistor array substrate shown in FIG. 7.

DETAILED DESCRIPTION OF THE PREFERRED EMBODIMENTS

Reference will now be made in detail to the preferred embodiments of the present invention, examples of which are illustrated in the accompanying drawings.

Figure 5:
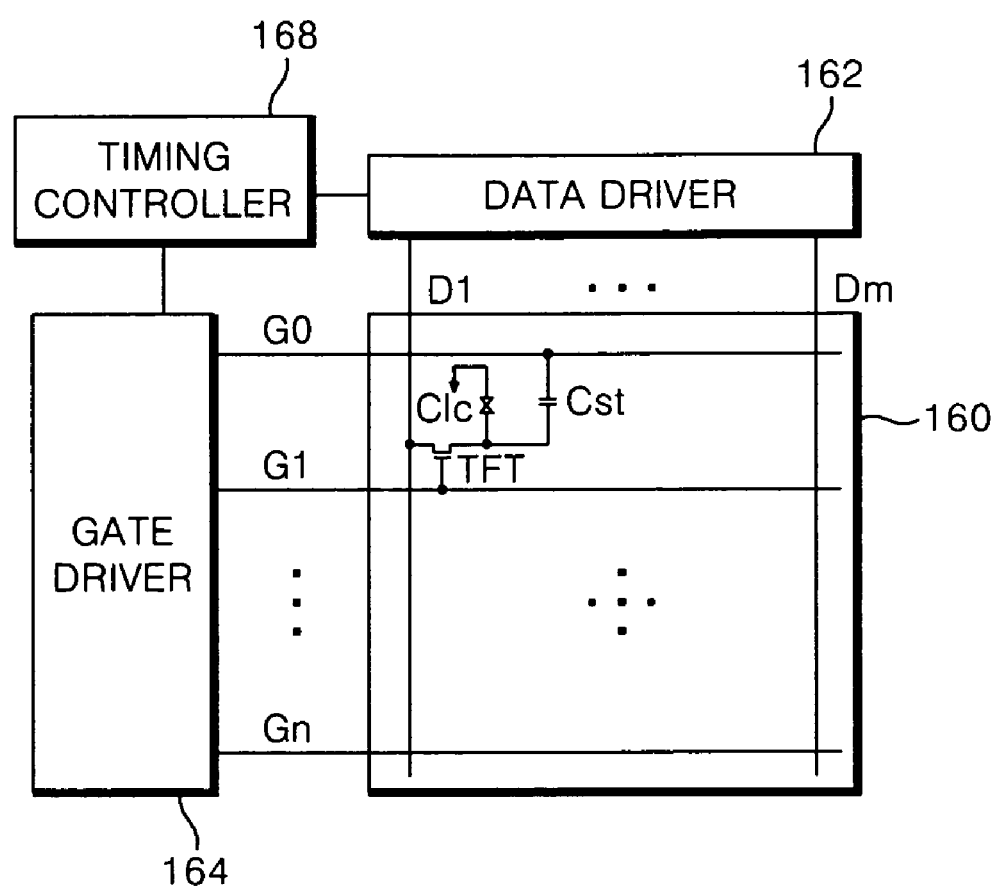
FIG. 5 is a block diagram representing a liquid crystal display device according to an embodiment of the present invention.

FIG. 5 is a block diagram representing a liquid crystal display device according to an embodiment of the present invention. As shown in FIG. 5, a liquid crystal display device includes a liquid crystal display panel with m number of data lines D1 to Dm and n number of gate lines G1 to Gn arranged in a matrix shape; a data driver 162 for supplying a data voltage to the data lines D1 to Dm of the liquid crystal display panel 160; a gate driver 164 for supplying a gate voltage to the gate lines G1 to Gn; and a timing controller 168 for controlling the data driver 162 and the gate driver 164. The data driver 162 converts digital video data into an analog video data voltages and to supplies the analog video data voltages to the data lines D1 to Dm in response to a control signal from the timing controller 168. The gate driver 164 sequentially supplies a gate voltage Vgh, which is synchronized with the analog video data voltages, to the gate lines G1 to Gn to select a horizontal line of the liquid crystal display panel 160 that are supplied the analog video data voltages in response to the control signal from the timing controller 168. The timing controller 168 generates control signals for controlling the gate driver 164, the data driver 162 by use of a vertical/horizontal synchronization signal and a clock signal.

The liquid crystal display panel 160 includes a thin film transistor array substrate and a color filter array substrate that face each other with a liquid crystal therebetween. Each pixel cell (P) of the liquid crystal display panel 160 includes a liquid crystal cell Clc; a TFT 106 formed at the crossing of one of the data lines D1 to Dm and one of the gate lines G1 to Gn; and a storage capacitor Cst for storing a voltage supplied to the liquid crystal cell Clc.

Figure 6:
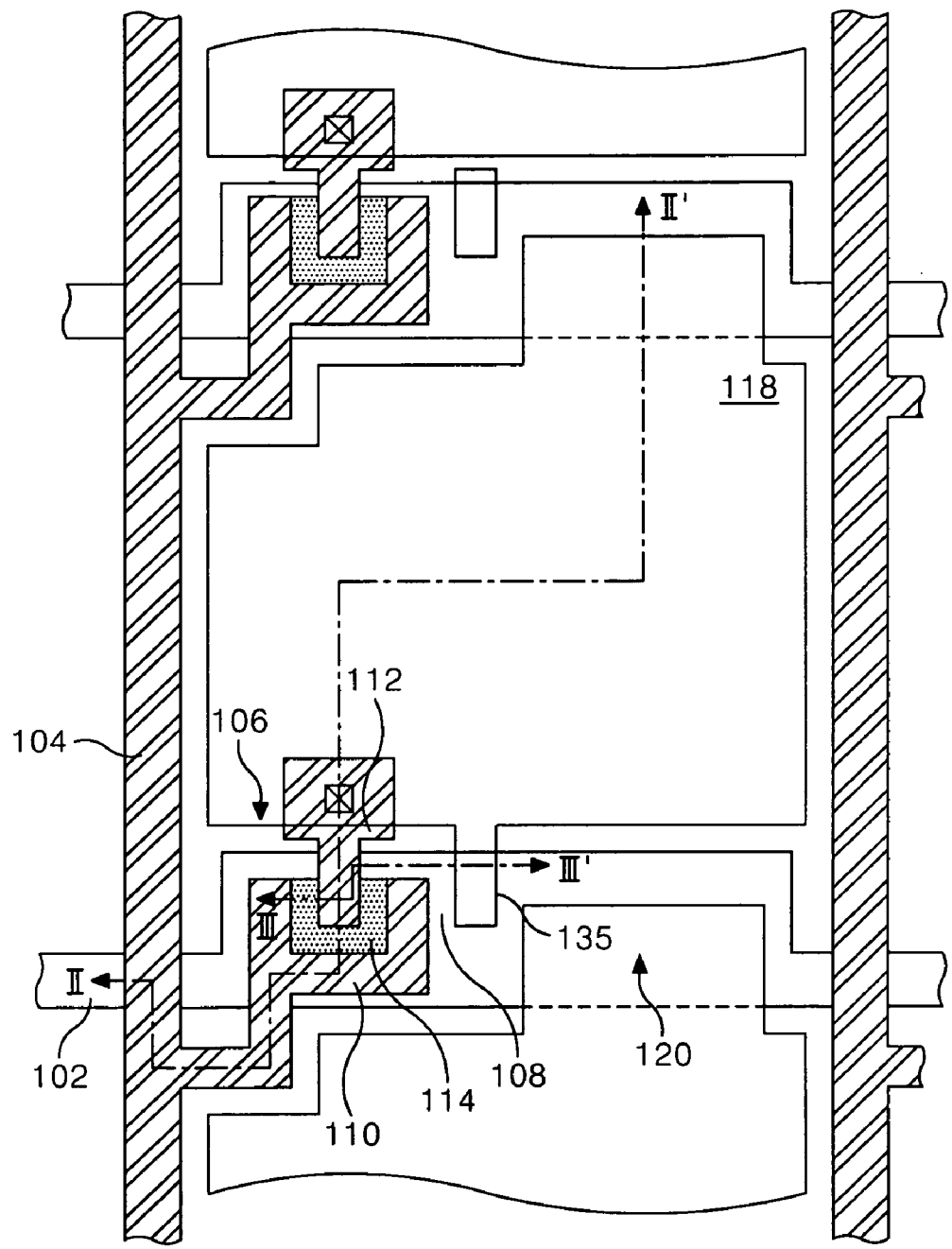
FIG. 6 is a plan view representing a thin film transistor array substrate corresponding to one pixel cell of FIG. 5.
Figure 7:
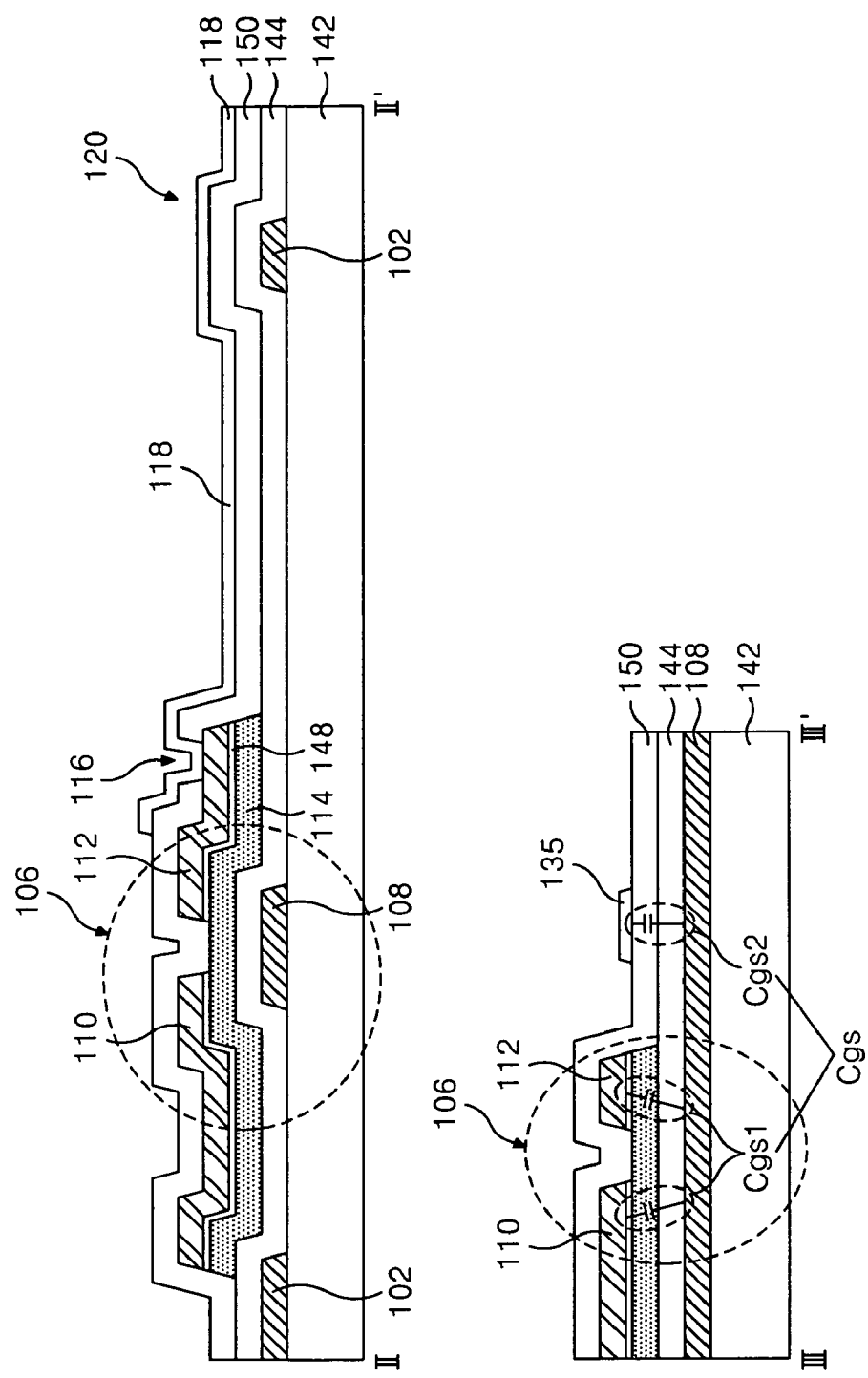
FIG. 7 is a cross-sectional diagram illustrating the thin film transistor array substrate shown in FIG. 6 along lines II-II' and III-III'.

FIG. 6 is a plan view representing a thin film transistor array substrate corresponding to one pixel cell of FIG. 5, and FIG. 7 is a cross-sectional diagram illustrating the thin film transistor array substrate shown in FIG. 6 along lines II-II' and III-III'. For ease of explanation, only one pixel cell, which can realize one color among the red, green colors is shown and described in FIGS. 6 and 7. The thin film transistor array substrate shown in FIGS. 6 and 7 includes a gate line 102 and a data line 104, which are formed on the lower substrate 142 with a gate insulating film 144 therebetween; a TFT 106 formed at the crossing of the gate line 102 and the data line 104; a pixel electrode in the pixel cell defined by the gate line 102 and the data line 104; a storage capacitor 120 formed by a part of the pixel electrode 118 overlapping the pre-stage gate line 102, which is the gate line of an adjacent pixel cell; and a protrusion 135 from the pixel electrode 118 forming a parasitic capacitor with the gate electrode 108 of the TFT 106 and positioned directly between the TFT 106 and a pre-stage pixel electrode 118, which is the pixel electrode of an adjacent pixel cell.

The TFT 106 includes a gate electrode 108 connected to the gate line 102; a source electrode 110 connected to the data line 104; a drain electrode 112 connected to the pixel electrode 118; and an active layer 114 overlapping the gate electrode 108 and forming a channel between the source electrode 110 and the drain electrode 112. The active layer 114 is overlapped by the data line 104, the source electrode 110 and the drain electrode 112. The channel of the active layer 114 is between the source electrode 110 and the drain electrode 112. Ohmic contact layers 148 are formed between the active layer 114 and each of the data line 4 and the source electrode 110 to form ohmic contacts between the active layer 114 and each of the data line 104 and the source electrode 110. Herein, the channel between the source electrode 110 and the drain electrode 112 is formed in a 'U' shape, thereby improving current mobility. The gate electrode 108 of the TFT 106 can extend from the gate line 102 in a direction perpendicular to the gate line 102. In the alternative, the gate electrode 108, can extend in a direction parallel to the gate line 102, as shown in FIG. 6. In another alternative, the gate line 102 itself can be the gate electrode 108. The TFT 106 switches a pixel voltage signal from the data line 104 to the pixel electrode 118 in response to a gate signal supplied to the gate line 102.

The pixel electrode 118 is connected to the drain electrode 112 of the TFT 106 through a contact hole 116 that penetrates the passivation film 150. The pixel electrode 118 generates a potential difference with the common electrode formed on the color filter array substrate (not shown) with the pixel voltage. The potential difference causes liquid crystal molecules located between the TFT array substrate and the color filter array substrate to rotate by dielectric anisotropy, and transmits the light from a light source through the pixel electrode and the color filter array substrate.

The storage capacitor 120 is formed by the pixel electrode 118 overlapping the pre-stage gate line 102. A gate insulating film 144 and a passivation film 150 are located between the gate line 12 and the pixel electrode 118. The storage capacitor 120 maintains the pixel voltage on the pixel electrode 118 until the next pixel voltage is applied.

Figure 8:
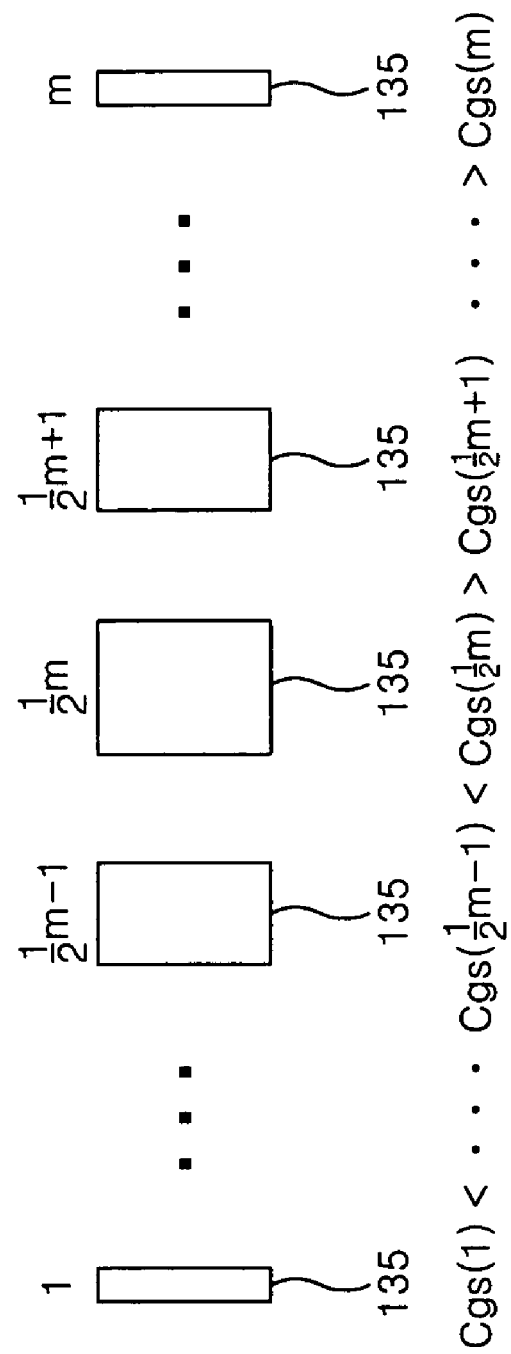
FIG. 8 is a diagram representing an area of a protrusion in accordance with a location of a pixel cell.

FIG. 8 is a diagram representing an area of a protrusion in accordance with a location of a pixel cell. As shown in FIG. 8, the protrusion 135 is formed in each pixel cell such that the area of the protrusion 135 decreases in pixels cells as the pixels cells become farther from the center of m number of pixels cells connected to the same gate line 102. The protrusion 135 overlaps the gate electrode 108 of the TFT 106 to form a parasitic capacitor to compensate for the deviation of a common voltage Vcom supplied to the liquid crystal display panel.

Figure 1:
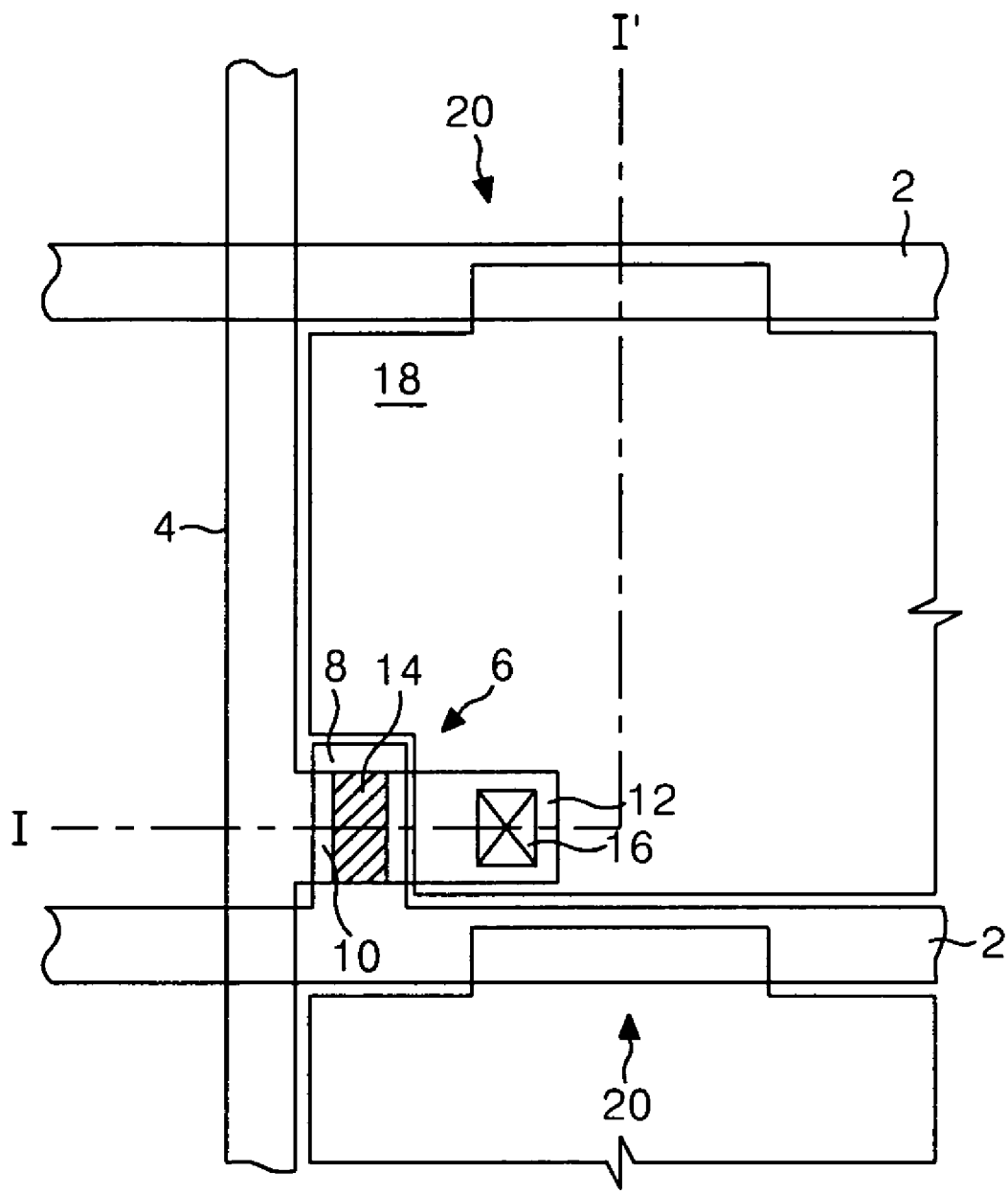
FIG. 1 is a plan view illustrating a part of a thin film transistor array substrate of a liquid crystal display panel of the related art.
Figure 2:
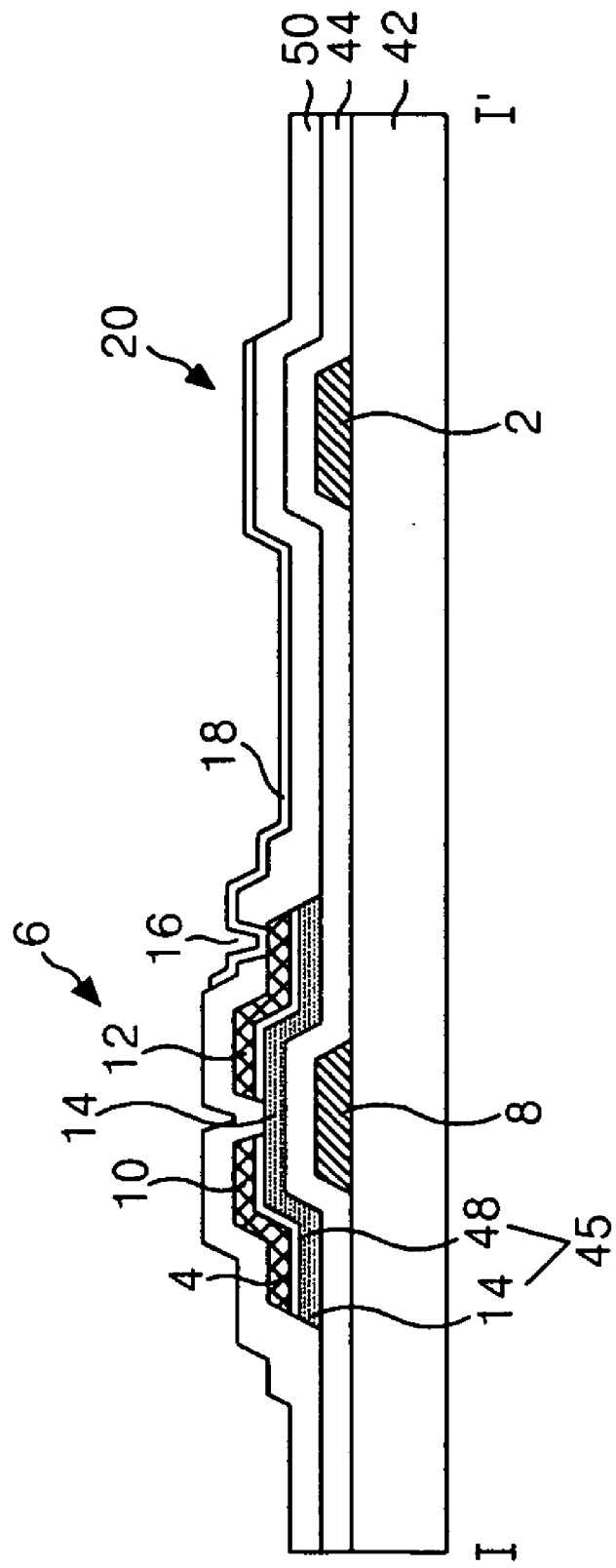
FIG. 2 is a cross-sectional diagram illustrating the thin film transistor array substrate shown in FIG. 1 along line I-I'.
Figure 3A:
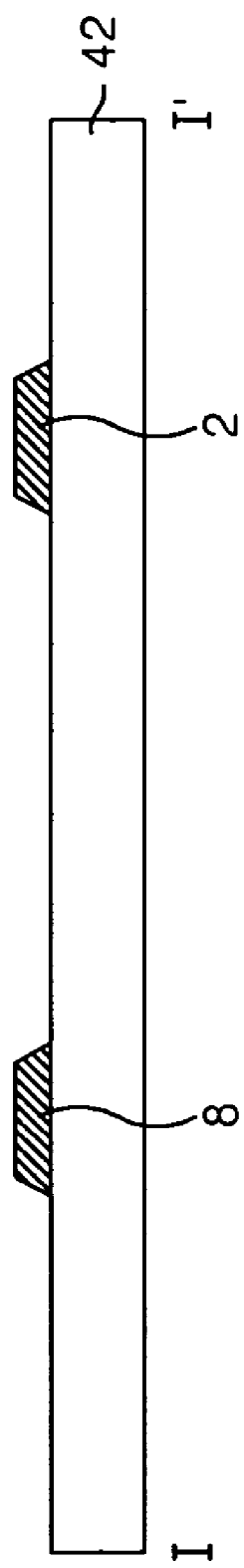
FIGS. 3A to 3D are cross-sectional diagrams illustrating a fabricating method of the thin film transistor array substrate shown in FIG. 2.
Figure 3B:
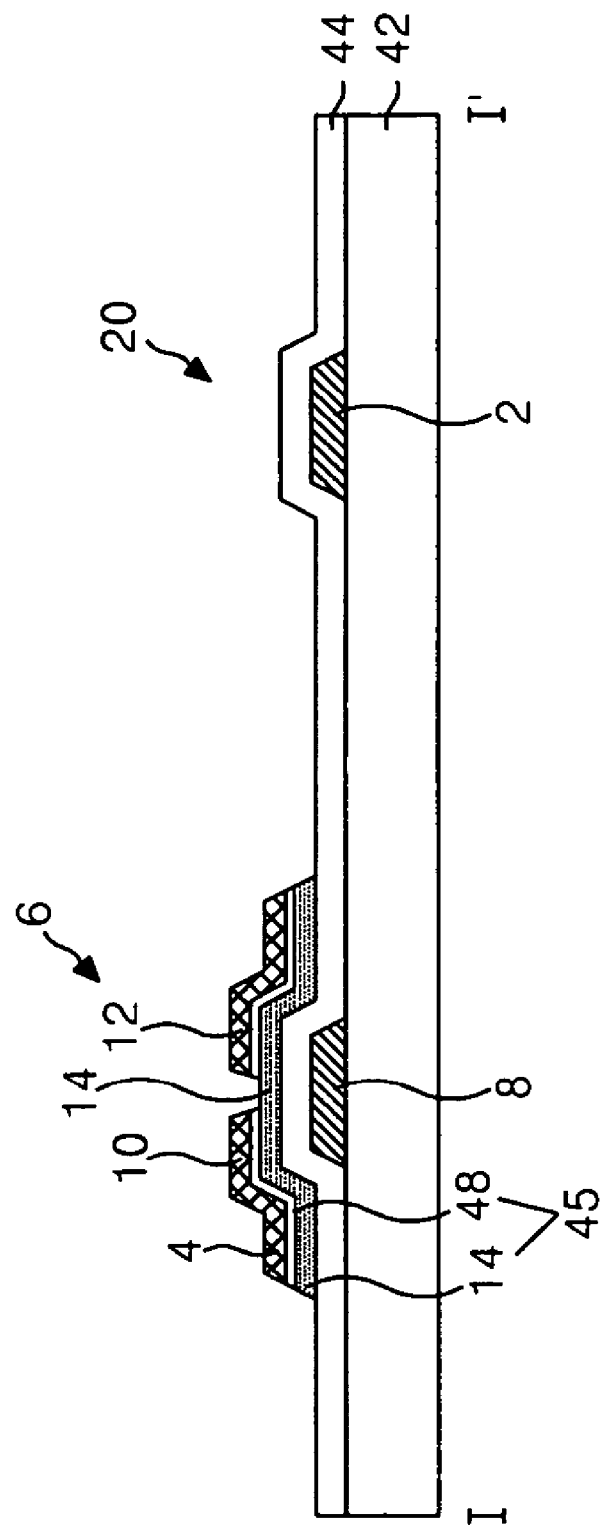
Figure 3C:
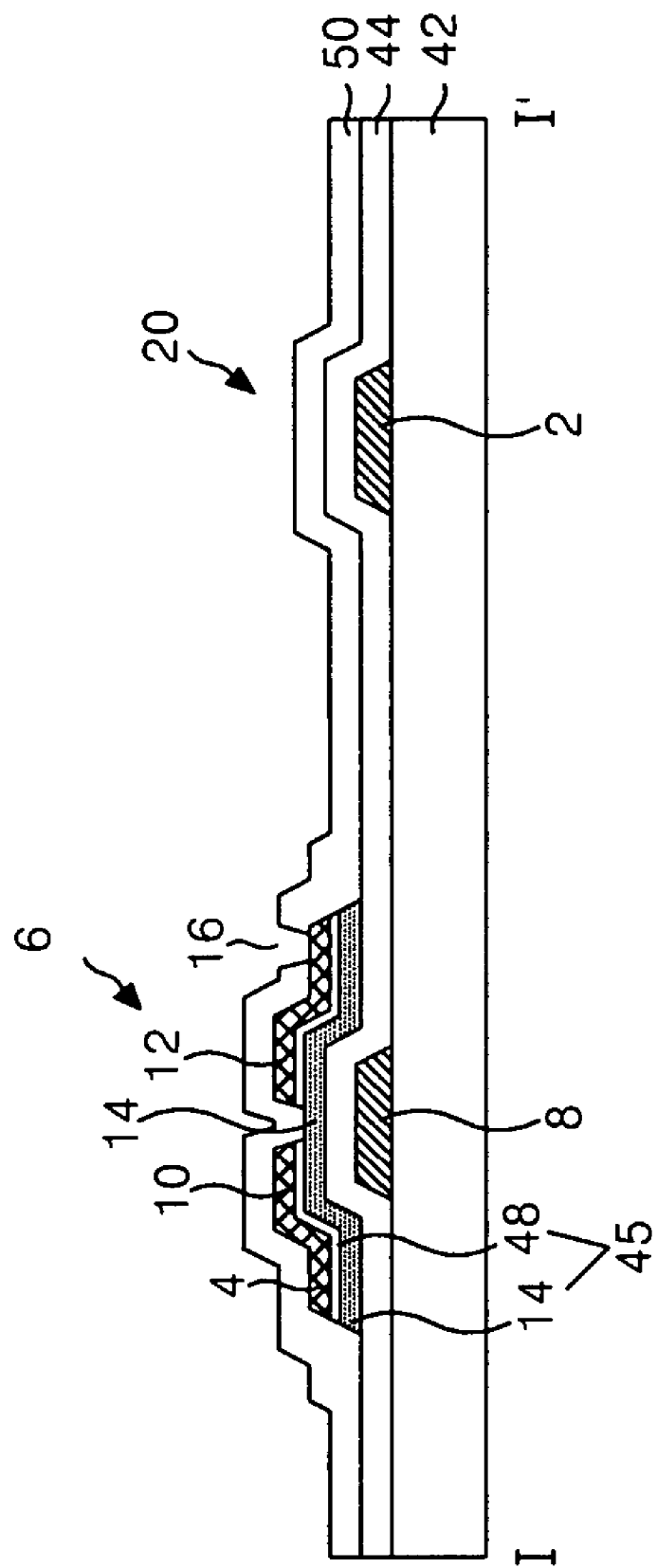
Figure 3D:
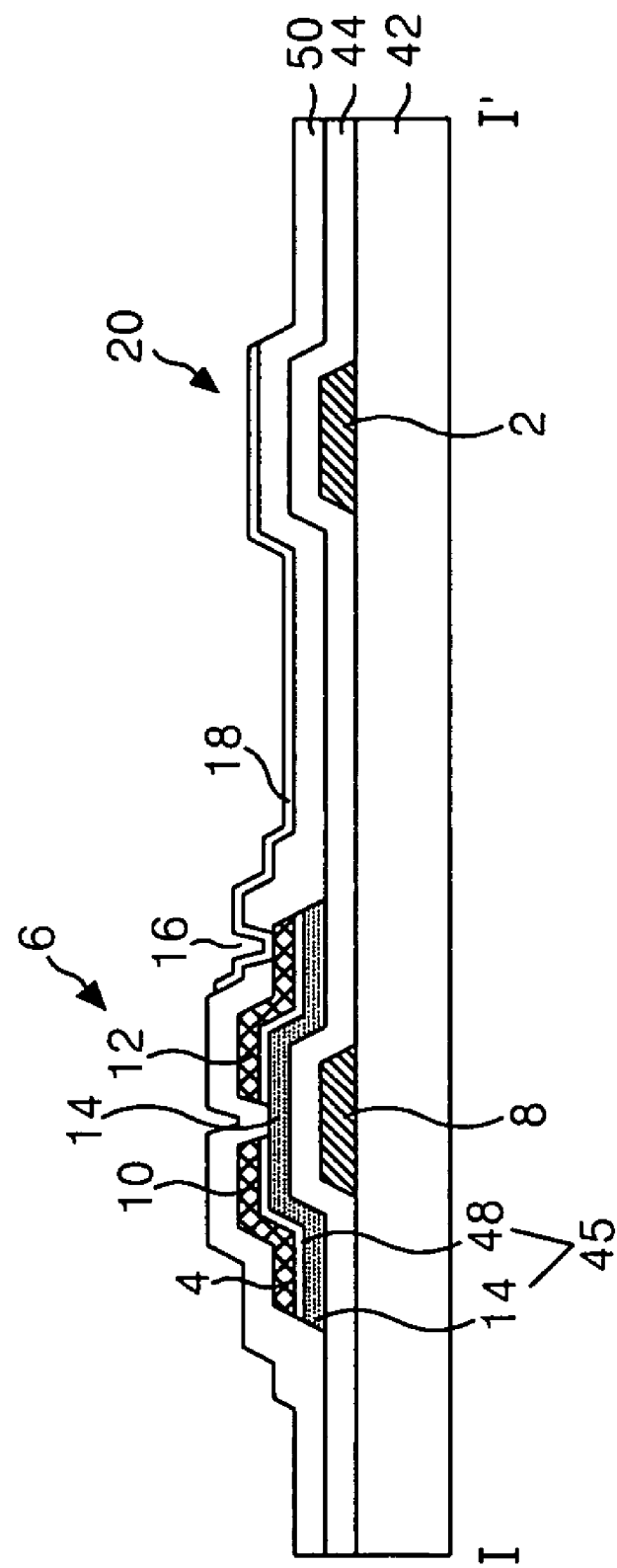
Figure 4:
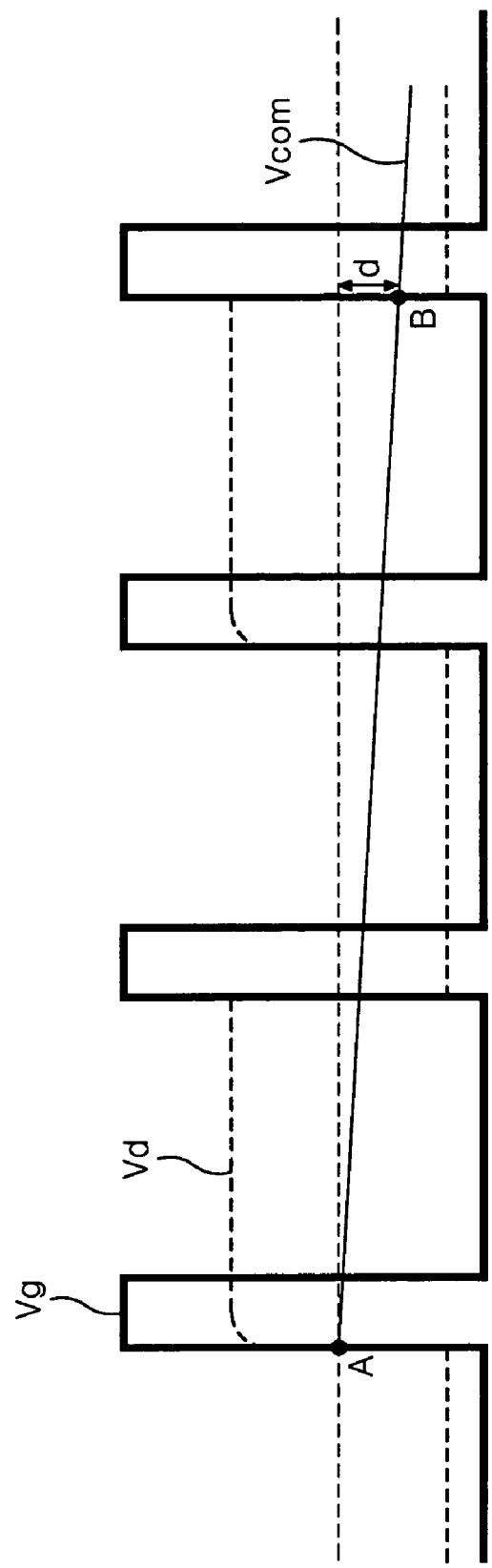
FIG. 4 is a waveform diagram representing a voltage drop in accordance with locations of a common voltage and voltages supplied to the liquid crystal display panel.

Referring to FIG. 4 of the related art, a data voltage Vd and a gate voltage Vg are supplied to the pixel cells P while a DC common voltage Vcom is supplied to a common electrode (not shown) on either the color filter array substrate of a TN mode liquid crystal display panel or the TFT array substrate of an IPS mode liquid crystal display panel. However, a common voltage Vcom value supplied to the common electrode changes depending on the location in the liquid crystal display panel 160 due to a line resistance of the gate line 102. The line resistance of the gate line 102 for a pixel cell increases as a pixel cell becomes farther away from a common voltage supplier. As a result, a common voltage Vcom value supplied to a location along the common electrode also becomes different.

Figure 9:
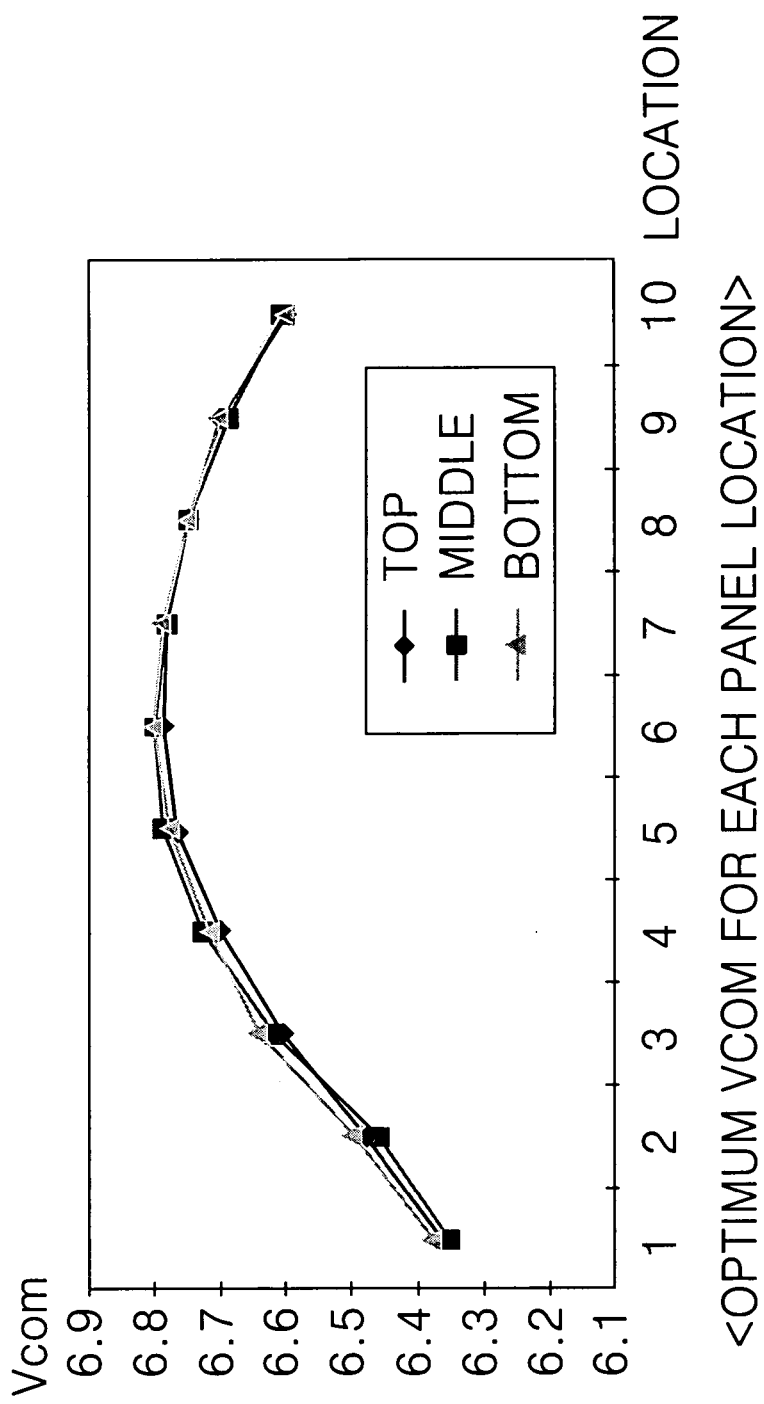
FIG. 9 is an experimental data representing a change in an optimum common voltage in accordance with a location of a pixel cell.

FIG. 9 is an experimental data representing a change in an optimum common voltage in accordance with a location of a pixel cell. Referring to the experimental data of FIG. 9, the largest voltage Vcom occurs in the center of the liquid crystal display panel where the largest resistance is expected to appear. However, the common voltage Vcom supplied to each of the pixel cells P is a direct current DC and cannot be controlled globaly. Accordingly, embodiments of the present invention propose a method of supplying a common voltage with a uniform value to each pixel cell by controlling a parasitic capacitance value within each of the pixel cells in accordance with the extent that the common voltage Vcom supplied from a common voltage supplier is affected by the line resistance.

Generally, the common voltage Vcom value has a characteristic of being proportional to a feed through voltage $\Delta Vp$. By use of such a characteristic, embodiments of the present invention reduces the deviation between the common voltages Vcom supplied to each of the pixel cells by forming a large $\Delta Vp$ value in an area of the liquid crystal display panel where the common voltage needs to be large as demonstrated by experimental data, such as shown in FIG. 9. That is to say, the $\Delta Vp$ value within a plurality of pixel cells P connected to the same gate line 102 is made to be lower in the pixel cells P as the pixel cells P go from the pixel cell located in the center of the liquid crystal display panel to pixel cells P located on the left and on the right edges of the liquid crystal display panel, thereby compensating the deviation of the common voltage Vcom according to a location on the liquid crystal display panel.

The protrusion 135 in embodiments of the present invention is provided to compensate the deviation of the common voltage Vcom by controlling the $\Delta Vp$ value. Generally, the $\Delta Vp$ value is defined as the following Mathematical Formula 1.

$$\Delta Vp = (Cgs/(Cgs+Clc+Cst))\Delta Vg \quad \text{[Mathematical Formula 1]}$$

Herein, Cgs is a parasitic capacitor formed between the gate electrode and the drain electrode of the TFT or the gate electrode and the source electrode, $\Delta Vg$ is a difference voltage of a gate high voltage Vgh and a gate low voltage Vgl, Cst is a capacity of the storage capacitor 120, and Clc is a capacitance by the liquid crystal.

FIG. 10 is a diagram representing a characteristic for each location of a common voltage which is optimized by the protrusion according to an embodiment of the present invention. As can be deduced from the Mathematical Formula 1, $\Delta Vp$ is proportional to the Cgs value. Embodiments of the present invention sets the size of the Cgs value of a location in correspondence to the curve in FIG. 9, such that a uniform common voltage is supplied irrespective of the location of a pixel cell, as shown in FIG. 10.

Referring to FIG. 7, the Cgs in embodiments of the present invention includes a first Cgs (Cgs 1) between the source/drain electrodes 110 and 112 and the gate electrode 108, and a second Cgs (Cgs 2) between the protrusion 135 and the gate electrode 108. Thus, embodiments of the present invention further include the second Cgs (Cgs 2) between the protrusion 135 and the gate electrode 108 as compared to the related art. The second Cgs (Cgs 2) is controlled by controlling the size of the protrusion 135 in each pixel cell location such that the $\Delta Vp$ value can be controlled for each location. In another words, the protrusion 135 together with the gate line 102 of the TFT 106 forms the parasitic capacitor, and the value of the parasitic capacitor can be controlled by controlling the area of the protrusion 135.

As shown in FIG. 8, the area of the protrusion within each of the pixel cells P is made smaller as the pixel cells P become farther away from the central pixel cell P of the liquid crystal display panel or larger as the pixel cells P become closer to the center of the liquid crystal display panel from the outer part of the liquid crystal display panel, thereby compensating for the deviation of the common voltage.

The Cgs and $\Delta Vp$ within the pixel cell can be shown in the following Mathematical Formulas 2 and 3.

$$Cgs(1) < \ldots < Cgs\{(\tfrac{1}{2})m-1\} < Cgs\{(\tfrac{1}{2})m\} > Cgs\{(\tfrac{1}{2})m+1\} > \ldots > Cgs(m) \quad \text{[Mathematical Formula 2]}$$

(1 to m are the number of the pixel cells which are connected in common to the gate line)

$$\Delta Vp(1) < \ldots < \Delta Vp\{(\tfrac{1}{2})m-1\} < \Delta Vp\{(\tfrac{1}{2})m\} > \Delta Vp\{(\tfrac{1}{2})m+1\} > \ldots > \Delta Vp(m) \quad \text{[Mathematical Formula 3]}$$

(1 to m are the number of the pixel cells which are connected in common to the gate line)

The liquid crystal display panel according to embodiments of the present invention sets the value of the parasitic capacitor (Cgs 2) between the gate electrode 108 and the protrusion 135 to be smaller in the pixel cells P as the pixel cells P go to the left and go to the right from the central pixel cell P among the pixel cells P connected to the same gate line, or sets the value of the parasitic capacitor (Cgs 2) between the gate electrode 108 and the protrusion 135 to be larger for the pixel cells P as the pixel cells P go towards the pixel cell P located at the center from the left edge and from the right edge. Accordingly, the Cgs values within the pixel cell P have the same relation as in Mathematical Formula 2, and the $\Delta Vp$ values have the same relation as in Mathematical Formula 3, thereby reducing the deviation of the common voltage Vcom in accordance with the location of the pixel cells P in the liquid crystal display panel. As a result, it is possible to prevent a residual image and/or flicker caused by the deviation of the common voltage Vcom.

Even though the protrusion 135 has a smaller area in the pixel cells P as the pixel cells P go towards the center from both the left and right among m number of pixels, the area can be adjusted in a longitudinal direction. That is to say, the length of the protrusion 135 can be extended or shortened to control the area while a line width thereof remains intact. In other words, the protrusion 135 can either be further extended over the gate line 102 or extend less over the gate line 102.

Figure 11A:
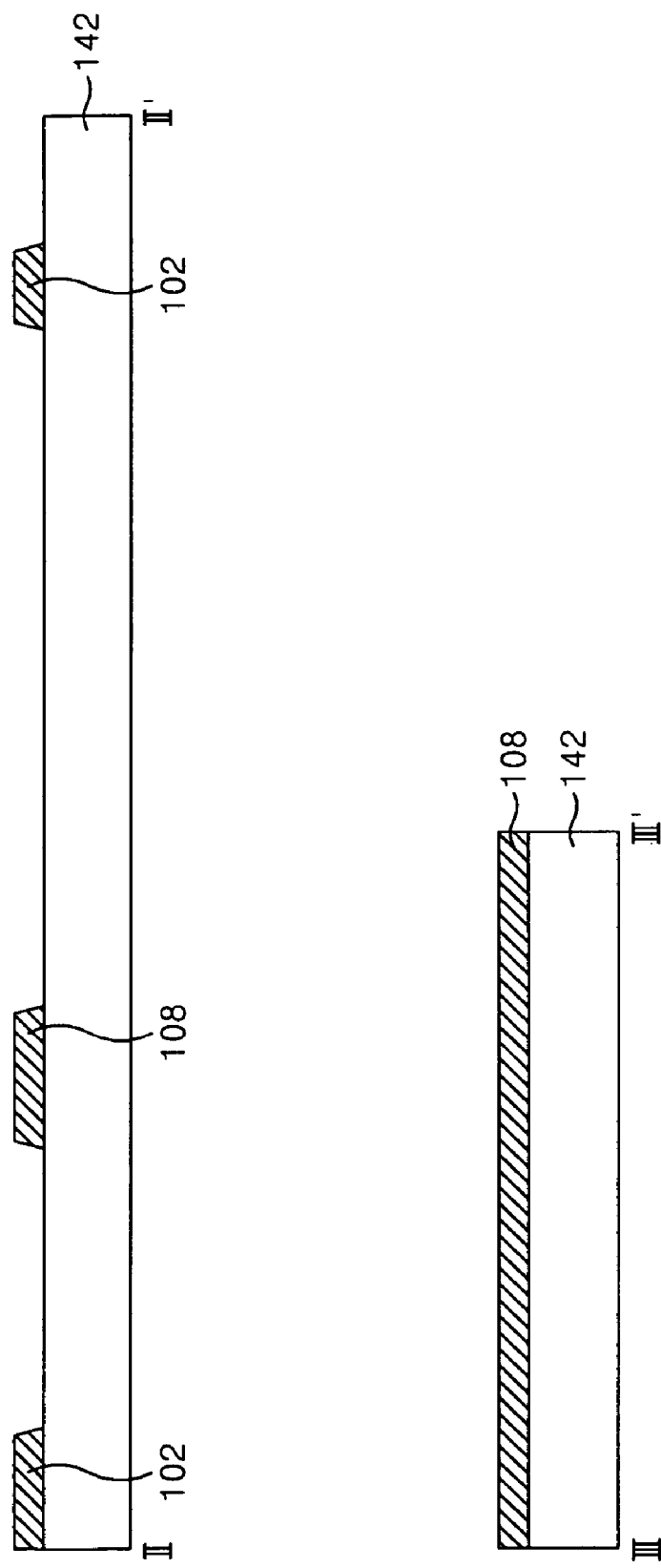

FIGS. 11A to 11D are cross-sectional diagrams illustrating a fabricating method of the thin film transistor array substrate shown in FIG. 7. As shown in FIG. 11A, a gate pattern, including the gate electrode 108, the gate line 102, is formed on the lower substrate. More specifically, a gate metal layer is formed on the lower substrate 142 by a deposition method, such as sputtering. Subsequently, the gate metal layer is patterned by a photolithography process using a mask and an etching process, thereby forming the gate pattern, including the gate line 102 and the gate electrode 108. The gate metal can be a single or double layer structure. Further, the gate metal can be one of chrome Cr, molybdenum Mo, an aluminum group metal and combinations thereof.

As shown in FIG. 11B, the gate insulating film 144, the active layer 114, the ohmic contact layer 148 and the source/drain patterns are sequentially formed over the lower substrate 142 where the gate patterns are formed. The gate insulating film 144, an amorphous silicon layer, an n+ amorphous silicon layer and a source/drain metal layer are sequentially formed by a deposition method, such as PECVD or sputtering, on the lower substrate 142 where the gate pattern is formed.

A photo-resist pattern is then formed on the source/drain metal layer by a photolithography process using a mask. In this case, the mask is a diffractive exposure mask having a diffractive exposure part in the channel part of the thin film transistor, thus a photo-resist pattern of the channel part is made to have a lower height than other source/drain pattern part. Subsequently, the source/drain metal layer is patterned by a wet etching process using the photo-resist pattern, thereby forming the source/drain pattern inclusive of the data line 104, the source electrode 110, the drain electrode 112 integrated with the source electrode 110, and a storage lower electrode 122. Then, the n+ amorphous silicon layer and the amorphous silicon layer are simultaneously patterned by a dry etching process using the same photo-resist pattern, thereby forming the ohmic contact layer 148 and the active layer 114. The ohmic contact layer 148 and the source/drain pattern of the channel part are then etched by the dry etching process after removing the photo-resist pattern which has a relatively low height in the channel part by an ashing process. Subsequently, the photo-resist pattern remaining on the source/drain pattern part is removed by a stripping process. An inorganic insulating material, such as silicon oxide SiOx or silicon nitride SiNx is used as the material of the gate insulating film 144. One of Molybdenum Mo, titanium Ti, tantalum Ta, molybdenum Mo alloy, copper Cu, and an aluminum group metal is used as the source/drain metal.

Figure 11C:
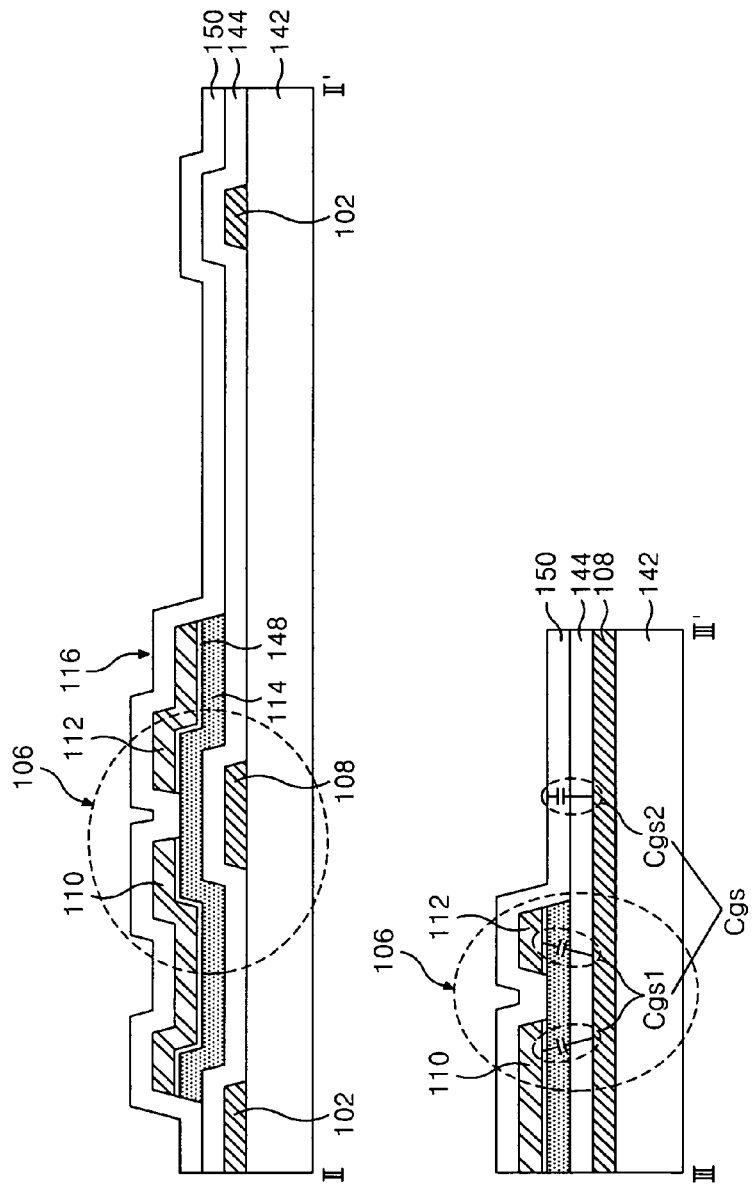

As shown in FIG. 11C, the passivation film 150 is formed by a deposition method, such as PECVD, on the entire surface of the gate insulating film 144 where the source/drain pattern is formed. Then, the passivation film 150 is patterned by a photolithography process using a mask and an etching process, thereby forming a contact hole 116 which exposes the drain electrode 112. An inorganic insulating material like the gate insulating film 94 or an organic insulating material with a low dielectric constant, such as acrylic organic compound, BCB or PFCB, is used as the material of the passivation film 150.

As shown in FIG. 11D, a transparent electrode pattern is formed on the passivation film 50. More specifically, a transparent electrode material is deposited on the entire surface of the passivation film 150 by a deposition method, such as sputtering. Subsequently, the transparent electrode material is patterned by the photolithography process using a mask and an etching process, thereby forming the transparent electrode pattern, including the pixel electrode 118 and the protrusion 135. The pixel electrode 118 is electrically connected to the drain electrode 112 through the contact hole 116 and overlaps the pre-stage gate line 102 to form a storage capacitor 120. Indium tin oxide ITO, tin oxide TO or indium zinc oxide IZO is used as the transparent electrode material.

The protrusion 135 is located to be adjacent to the TFT 106 and forms the parasitic capacitor with the gate electrode 108 with the passivation film 150 and the gate insulating film 144 therebetween.

As described above, the liquid crystal display device and the fabricating method thereof according to the present invention forms protrusion that forms the parasitic capacitor with the gate electrode of the thin film transistor in an area adjacent to each of the thin film transistor of each pixel cell. The area of the protrusion is formed to have smaller area in pixel cells as the pixel cells go to the left and go to the right from the pixel cell located in the center among the pixel cells, which are all connected to the same gate line. Accordingly, the value of the parasitic capacitor (Cgs 2) between the gate electrode and the protrusion is made smaller pixel cells as the pixel cells go to the left and go to the right from the pixel cell located in the center among the pixel cells, which are all connected to the same gate line, or larger as the pixel cells go to the central pixel cell from the left and from the right edges of the liquid crystal display panel, thereby controlling the size of $\Delta Vp$ and Cgs of each pixel cell. As a result, the deviation of the common voltage supplied in accordance with the location of the pixel cell can be reduced, thereby improving the picture quality by preventing a residual image and/or flicker.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A liquid crystal display panel comprising:
   a first pixel cell defined at a crossing of a first gate line and a data line; and
   a second pixel cell defined at a crossing of a second gate line and the data line,
   wherein the first and second pixel cells are disposed along a first horizontal direction corresponding to a direction of the data line;
   wherein each of the first and second pixel cells comprises:
      a thin film transistor located at a crossing of one of the first and second gate lines and the data line;
      a pixel electrode connected to the thin film transistor and including first and second sides parallel and opposite to each other;
      a protrusion of the pixel electrode that extends from the first side of the pixel electrode along the first horizontal direction; and
      a portion of the pixel electrode that extends from the second side of the pixel electrode along a second horizontal direction opposite and parallel to the first horizontal direction,
   wherein the thin film transistor comprises:
      a gate electrode extending from the one of the first and second gate lines;
      an insulating film on the gate electrode, the first gate line, and the second gate line;
      a semiconductor pattern which overlaps the gate electrode;
      a source electrode disposed on the semiconductor pattern and extending from the data line; and
      a drain electrode facing the source electrode, connecting to a portion of the pixel electrode that passes through a passivation film, and spaced apart from the protrusion in a third horizontal direction perpendicular to the first and second horizontal directions,
   wherein the protrusion of the first pixel cell extends at least between the portion of the second pixel cell and the source electrode of the first pixel cell in the third horizontal direction,
   wherein the drain electrode of the first pixel cell, the source electrode of the first pixel cell, the protrusion of the first pixel cell, and the portion of the second pixel cell are spaced apart from each other along the third horizontal direction and are sequentially disposed on the gate electrode of the first pixel cell along the third horizontal direction, and
   wherein each of the first, second, and third horizontal directions are parallel to a display surface of the liquid crystal display panel.

2. The liquid crystal display panel according to claim 1, wherein the protrusion and the portion have the same material as that of the pixel electrode.

3. The liquid crystal display panel according to claim 1, wherein the protrusion and the portion overlap the gate electrode with the insulating film and the passivation film between the protrusion and the portion and the gate electrode.

4. The liquid crystal display panel according to claim 1, wherein the protrusion and the portion are formed of indium tin oxide (ITO).

5. The liquid crystal display panel according to claim 1, wherein the protrusion and the portion are formed of tin oxide (TO).

6. The liquid crystal display panel according to claim 1, wherein the protrusion and the portion are formed of indium zinc oxide (IZO).

7. The liquid crystal display panel according to claim 1, wherein the second side of the pixel electrode is not overlapped with the gate electrode of the thin film transistor.

8. The liquid crystal display panel according to claim 1, wherein a parasitic capacitor is formed from the insulating film and the passivation film between the protrusion and the gate electrode.

9. The liquid crystal display panel according to claim 1, wherein the liquid crystal display panel includes a plurality of the first and second pixel cells connected to a respective plurality of the first and second gate lines, the protrusions of the first and second pixel cells becoming smaller as the first and second pixel cells go farther from a center of the first and second pixel cells that are connected to the respective plurality of the first and second gate lines.

10. A liquid crystal display panel comprising:
a first pixel cell defined at a crossing of a first gate line and a data line; and
a second pixel cell defined at a crossing of a second gate line and the data line,
wherein the first and second pixel cells are disposed along a first horizontal direction corresponding to a direction of the data line,
wherein each of the first and second pixel cells comprises:
one of the first and second gate lines;
a gate electrode on a substrate;
an insulating film on the gate electrode, and on the one of the first and second gate lines;
a semiconductor pattern on the insulating film and overlapping the gate electrode;
a source electrode and a drain electrode on the semiconductor pattern, and on the data line, wherein the gate electrode, the semiconductor pattern, the source electrode and the drain electrode make a thin film transistor, wherein the source electrode extends from the data line, and wherein the drain electrode faces the source electrode;
a passivation film on the data line, the source electrode and the drain electrode;
a pixel electrode on the passivation film, the pixel electrode contacting the drain electrode and passing through the passivation film and including first and second sides parallel and opposite to each other;
a protrusion of the pixel electrode extending from the first side of the pixel electrode along the first horizontal direction; and
a portion of the pixel electrode that extends from the second side of the pixel electrode along a second horizontal direction opposite and parallel to the first horizontal direction,
wherein the drain electrode is connected to a point of the pixel electrode located nearer to the first side than the second side of the pixel electrode,
wherein the source electrode is spaced apart from the protrusion in a third horizontal direction perpendicular to the first and second horizontal directions, and
wherein the protrusion of the first pixel cell extends at least between the portion of the second pixel cell and the source electrode of the first pixel cell,
wherein the drain electrode of the first pixel cell, the source electrode of the first pixel cell, the protrusion of the first pixel cell, and the portion of the second pixel cell are spaced apart from each other along the third horizontal direction and are sequentially disposed on the gate electrode of the first pixel cell along the third horizontal direction, and
wherein each of the first, second, and third horizontal directions are parallel to a display surface of the liquid crystal display.

* * * * *